United States Patent
Al-Shahrani

(10) Patent No.: US 8,217,692 B2
(45) Date of Patent: Jul. 10, 2012

(54) FREQUENCY SYNTHESIZER

(75) Inventor: Saad Mohammad Al-Shahrani, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 196 days.

(21) Appl. No.: 12/659,299

(22) Filed: Mar. 3, 2010

(65) Prior Publication Data

US 2011/0215847 A1  Sep. 8, 2011

(51) Int. Cl.
*H03L 7/06* (2006.01)
(52) U.S. Cl. ........................................ 327/157
(58) Field of Classification Search .................. None
See application file for complete search history.

(56) References Cited

U.S. PATENT DOCUMENTS

| | | | |
|---|---|---|---|
| 4,980,652 A | 12/1990 | Tarusawa et al. | |
| 5,107,220 A | 4/1992 | Andoh | |
| 5,173,665 A | 12/1992 | Norimatsu | |
| 5,260,842 A | 11/1993 | Leake et al. | |
| 5,889,437 A | 3/1999 | Lee | |
| 6,411,660 B1 | 6/2002 | Oh | |
| 6,600,351 B2 * | 7/2003 | Bisanti et al. | 327/157 |
| 6,828,864 B2 * | 12/2004 | Maxim et al. | 331/17 |
| 6,967,513 B1 * | 11/2005 | Balboni | 327/157 |
| 7,003,274 B1 | 2/2006 | Olip | |
| 7,436,229 B2 * | 10/2008 | Sidiropoulos et al. | 327/157 |
| 7,486,145 B2 | 2/2009 | Floyd et al. | |
| 7,502,631 B2 | 10/2009 | Hashemi et al. | |
| 7,764,094 B1 * | 7/2010 | Arora | 327/157 |
| 7,809,338 B2 * | 10/2010 | Tsfati | 455/76 |
| 2003/0086519 A1 | 5/2003 | Bushman et al. | |
| 2007/0075786 A1 | 4/2007 | Maxim et al. | |
| 2008/0157884 A1 | 7/2008 | Lee | |

\* cited by examiner

*Primary Examiner* — Lincoln Donovan
*Assistant Examiner* — Khareem E Almo
(74) *Attorney, Agent, or Firm* — Richard C. Litman

(57) ABSTRACT

The frequency synthesizer has two fixed frequency dividers, two charge pumps, five capacitors, a voltage controlled oscillator, and a transconductance voltage amplifier. The pulse widths of the input reference signal and the output signal are compared and the resultant signal is coupled to the oscillator to adjust its frequency. The circuit exhibits accurate frequency synthesizing, and thus can be used in wireless communication and signal processing systems. It provides a precise integer and fractional frequency division with a low phase noise. Moreover, it has a simple and compact structure that can be implemented in integrated circuit technologies such as CMOS.

5 Claims, 2 Drawing Sheets

FREQUENCY SYNTHESIZER

BACKGROUND OF THE INVENTION

1. Field of the Invention

The present invention relates to electronic circuits for generating signals at a desired frequency, and more particularly, to a frequency synthesizer in which the output frequency is adjusted based on comparison of the pulse width of an output signal to a reference signal, and which is capable of generating fractions and multiples of the reference frequency with a fast settling time.

2. Description of the Related Art

A frequency synthesizer is an electronics system or circuit that is used in communication and signal processing systems to generate a range of frequencies from a single stable frequency oscillator. A common approach to realize the frequency synthesizer is based on the Phase Locked Loop (PLL). The PLL is a feedback system which compares the frequencies of its input and output signals; the first component of the PLL system is the frequency or phase detector which carries out the frequency comparison. It is generally understood that error signals, which represents the difference between the input signals, is averaged using a low pass filter (LP) to generate a control signal. The resultant signal is coupled to a VCO to adjust its output frequency. The feedback process is continued to force the error signal to diminish. A frequency divider is inserted in the feedback loop to allow the output frequency to be a multiple of the reference frequency.

One of the desired criteria in the frequency synthesizer system is the fast settling time, which measures the ability of the communication system to perform channels scanning within the allowed acquisition period. Knowing that the loop bandwidth of the frequency synthesizer is inversely related to the settling time, it is therefore recommended to design the system to have a wide loop bandwidth. On the other hand, to minimize spurious emissions generated at the output of the phase detector, it is recommended to select the loop bandwidth to be a tenth of the reference frequency signals $F_{ref}$. Another disadvantage of the limited loop bandwidth is that it results in high close-in phase noise at the output.

Due to its role in the frequency selection of a frequency synthesizer, a frequency divider has received major attention from researchers in the field. Main types of frequency divider include integer frequency divider and fractional frequency divider.

In the former case, the input frequency and output frequency relation is given by $F_{out}=MF_{ref}$. M has integer values that are used to control the output frequency. In communication systems, M controls transmitting and receiving frequency channels. Therefore, $F_{ref}$ is constrained to be equal to the channel spacing to allow for channel selection through M, which imposes a limitation on the loop bandwidth of the PLL. Thus a long settling time is one of the main drawbacks of the PLL based integer frequency divider.

Although different frequency divider structures can be used to realize the M divider, typically, a Pulse Swallow divider is widely used. By simple analysis, it can be shown that M and $F_{out}$ are given by:

$$M=PN+S$$

$$f_{out}=PNf_{ref}+Sf_{ref}$$

In contrast to the integer frequency divider, a fractional frequency divider allows the output frequency to be a fraction of the reference frequency. Hence, the reference frequency $F_{ref}$, and consequently the loop bandwidth, can be made much greater than the channel spacing. Thus, the frequency synthesizer-based fractional divider does not suffer from the long settling time. The fractional division ratio is obtained by dividing the output signal by an integer number N for certain number of the output pulses P and by N+1 for another number of S pulses. The effective frequency division ratio M can be given by:

$$M = \frac{NP+(N+1)S}{P+S}.$$

A typical frequency synthesizer circuit comprises a fractional frequency divider. However, a frequency synthesizer-based fractional frequency divider suffers from a series effect called fractional spurs, which are generated from dividing the signal frequency by two different values. Fractional spurs modulate the VCO, and hence strong sideband signals are generated around the output frequency.

Thus, a frequency synthesizer solving the aforementioned problems is desired.

SUMMARY OF THE INVENTION

The frequency synthesizer has an input reference signal that is applied to a charge pump circuit in operable communication with a frequency divide-by-two unit, switches, and capacitors, which are arranged to measure the pulse width of the reference signal. A similar circuit configuration measures the pulse width of the output frequency. Pulse widths of both signals (reference and output signals) are subtracted, and the resultant voltage is coupled to the input of a voltage control oscillator (VCO) to adjust its output frequency.

The output of the VCO is fed back to the charge pump unit to complete a negative feedback loop. The frequency synthesizer presents a frequency synthesizing method that is based on the difference between two signals' pulse widths instead of their phase differences, as is done in PLL-based synthesizers. Thus, the method provides accurate frequency synthesis that can be used in wireless communication and signal processing systems. Moreover, the frequency synthesizer circuitry features a precise integer and fractional frequency divider having low phase noise. Additionally, the frequency synthesizer circuit exhibits a simple and compact structure that can be implemented as an integrated circuit.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
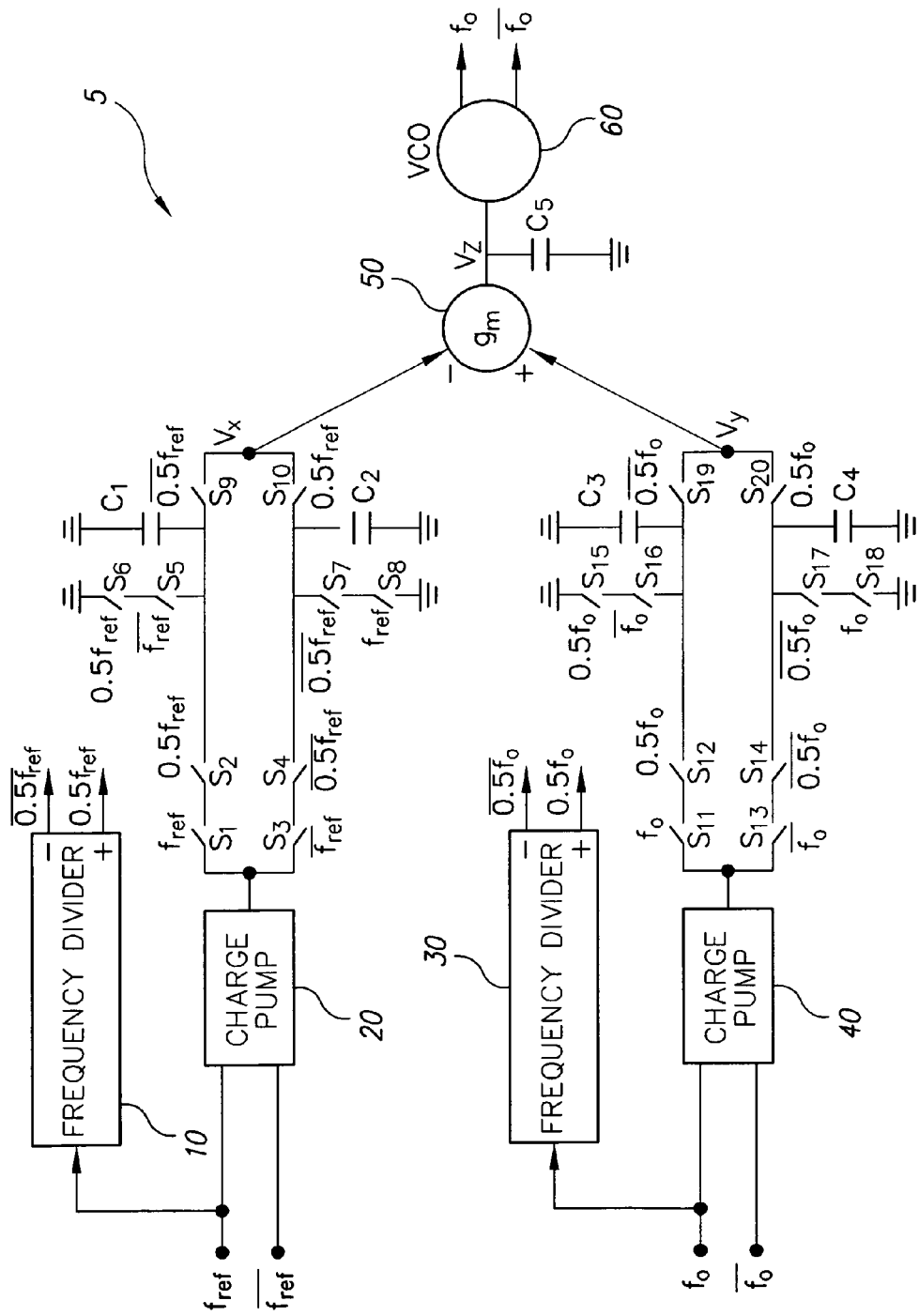
FIG. 1 is a block diagram of the frequency synthesizer, according to the present invention.

As shown in FIG. 1, the frequency synthesizer 5 has a first fixed divide-by-2 frequency divider 10, which accepts a reference frequency $f_{ref}$ as input, and a second fixed divide-by-2 frequency divider 30, which accepts an initial frequency $f_o$ as input. The first divider 10 has $0.5f_{ref}$ and its complement as outputs, which are routed to switches $S_2$, $S_4$ $S_6$, $S_7$ $S_9$ and $S_{10}$ at output of charge pump 20. Charge pump 20 input terminals accept reference frequency $f_{ref}$ and its complement. The $f_{ref}$ signal is routed to switches $S_1$, $S_3$, $S_5$, and $S_8$ at switched output of charge pump 20. Capacitor $C_1$ holds charge for the charge pump output at $S_9$ and $S_{10}$, respectively which is routed to the negative input of a transconductance amplifier 50 having a predetermined transconductance $g_m$.

Charge pump 40 has input terminals that accept initial frequency $f_o$ signal and its complement as input. The second divider 30 has $0.5fo$ and its complement as outputs, which are routed to switches $S_{12}$, $S_{14}$ $S_{15}$, $S_{17}$ $S_{19}$ and $S_{20}$ at charge pump 40. The $f_o$ signal and its complement are routed to switches $S_{11}$, $S_{13}$, $S_{16}$, and $S_{18}$ at switched output of charge pump 40. Capacitors $C_3$ and $C_4$ hold charge for the charge pump output at $S_{19}$ and $S_{20}$, respectively which is routed to the positive input of transconductance amplifier 50. Output $V_z$ of transconductance amplifier 50 is smoothed by capacitor $C_5$ and controls the frequency of voltage-controlled oscillator 60.

The inventive frequency synthesis circuitry 5 provides the frequency synthesis by comparing the pulse width of both reference signal $f_{ref}$ and output signal $f_o$. The pulse widths of the reference frequency $f_{ref}$ and the output frequency $f_o$ are sensed and stored at $V_x$ and $V_y$ nodes respectively. Therefore $V_x$ and $V_y$ are proportional to the period of $f_{ref}$ and $f_o$ signals respectively.

Figure 2:
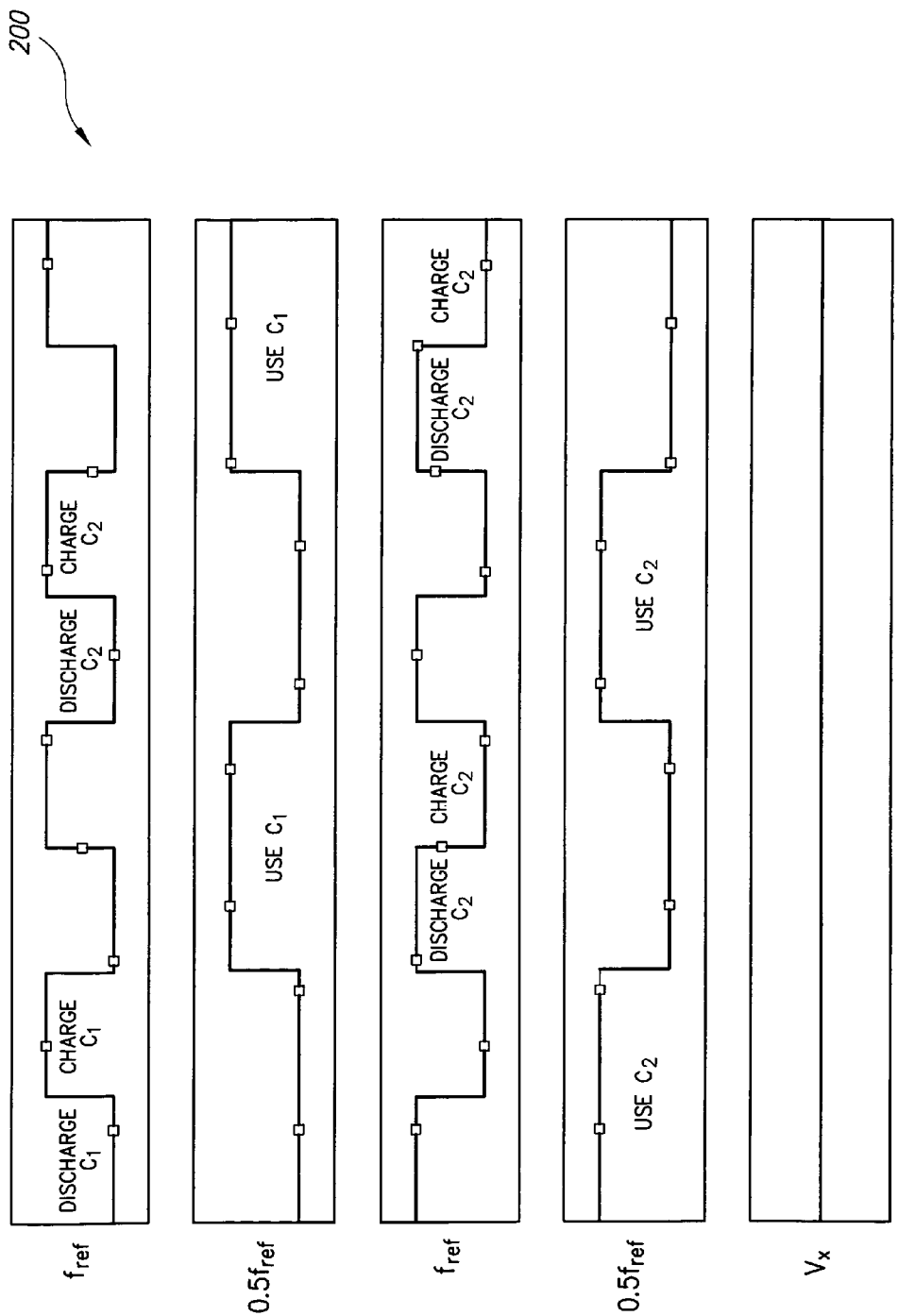
FIG. 2 is a multi-channel plot showing the voltage waveforms at different nodes along $f_{ref}$ path, according to the present invention.

As shown in FIG. 2 the multi-channel plot 200 displays the different states of reference signal $f_{ref}$, and the process of obtaining $V_x$. For example, in the case when $0.5f_{ref}$ signal is high and $f_{ref}$ is low switches $S_{5-6}$ are ON and the stored voltage across $C_1$ is discharged to zero volts. When $f_{ref}$ goes high $C_1$ will be charged for half cycle of $f_{ref}$ by a constant current $I_1$ provided by the charge pump 20.

By analogy, the voltage across $C_2$ can be obtained at the different state of signal $f_{ref}$. Capacitor $C_1$ is connected to $V_x$ in a first branch, or alternatively, $C_2$ is connected to $V_x$ in a second branch, thus $V_x$ will be updated every cycle of $f_{ref}$. Similarly voltage $V_y$, which senses the period of $f_o$, can be obtained. The voltage node $V_y$ is connected to $C_3$ in a first branch and $C_4$ in a second branch, alternatively, to maintain its value updated every cycle of $f_o$. $V_x$ and $V_y$ can be given by:

$$V_x = \frac{I_1 T_{ref}}{2C_1}; C_1 = C_2 \quad (1)$$

$$V_y = \frac{I_2 T_0}{2C_3}; C_3 = C_4 \quad (2)$$

showing that they have proportional relationship with the period of the reference signal $T_{ref}$ and the output signal $T_o$, respectively.

$V_y$ and $V_x$ are applied to the positive and negative terminals of the transconductance amplifier 5 respectively. The resultant output voltage $V_z$ of summation unit 50 can be given by:

$$V_z = g_m C_5 \left( \frac{I_2 T_0}{2C_3} - \frac{I_1 T_{ref}}{2C_1} \right) \quad (3)$$

The voltage has a proportional relationship with the difference between the periods of $f_{ref}$ and $f_o$. The parameter $g_m$ represents the transconductance of the amplifier 50.

$V_z$ is coupled to the input of the voltage control oscillator VCO 60 to adjust its output frequency to be precisely multiple of $f_{ref}$ according to the following equation, $$f_o = K f_{ref}; \text{ where } K = \frac{I_2 C_1}{I_1 C_3} \quad (4)$$

K represents the multiple factor, which can be realized through ratios of the capacitors and/or the charging currents in the two paths. This factor can be integer or fractional number, which provides a wide programmability feature for the presented invention. Fractional divider allows for easy programmability of K to obtain a desired output frequency and a precise channel selection. In CMOS technology, it is visible to achieve capacitor ratios with an error less than 0.5%, and consequently to implement precise frequency synthesizers.

It is to be understood that the present invention is not limited to the embodiment described above, but encompasses any and all embodiments within the scope of the following claims.

I claim:

1. A frequency synthesizer, comprising:
a reference fixed frequency divide-by-d divider having an input accepting a reference frequency signal, $f_{ref}$, outputs of the first fixed frequency divider being signals $(1/d)f_{ref}$ and $\overline{(1/d)f_{ref}}$, respectively;
an output fixed frequency divide-by-d divider having an input that accepts an initial frequency signal, $f_o$, outputs of the output fixed frequency divider being signals $(1/d)f_o$ and $\overline{(1/d)f_o}$, respectively;
a first controlled switch bank having an input and a capacitively coupled output, wherein the capacitively coupled output of the first controlled switch bank comprises a first capacitor $C_1$ connected to a first branch of the first controlled switch bank and a second capacitor $C_2$ connected to a second branch of the first controlled switch bank;
a second controlled switch bank having an input and a capacitively coupled output, wherein the capacitively coupled output of the second controlled switch bank comprises a third capacitor $C_3$ connected to a first branch of the second controlled switch bank and a fourth capacitor $C_4$ connected to a second branch of the second controlled switch bank;
a transconductance amplifier having a first polarized input, a second, oppositely polarized input, and a capacitively coupled transconductance amplifier output;
a first charge pump having inputs accepting the reference frequency signal, $f_{ref}$, and its complement $\overline{f_{ref}}$, respectively, output of the charge pump being connected to the input of the first controlled switch bank, individual switches of the controlled switch bank being controlled by the outputs of the reference fixed frequency divider, the output of the first controlled switch bank being connected to the first polarized input of the transconductance amplifier, wherein the capacitively coupled output of the first controlled switch bank having an output voltage of $$V_x = \frac{I_1 T_{ref}}{2C_1},$$

where $C_1 = C_2$, $I_1$ is the current output of the first charge pump and $T_{ref}$ is the period of the reference frequency signal $f_{ref}$;
a second charge pump having inputs accepting the initial frequency signal, $f_o$ and its complement $\overline{f_o}$, respectively, output of the second charge pump being connected to the input of the second controlled switch bank, individual switches of the second controlled switch bank being controlled by the outputs of the output fixed frequency divider, the output of the second controlled switch bank being connected to the second polarized input of the transconductance amplifier, wherein the capacitively coupled output of the second controlled switch bank has an output voltage of $$V_y = \frac{I_2 T_0}{2C_3},$$

where $C_3 = C_4$, $I_2$ is the current output of the second charge pump and $T_0$ is the period of the initial frequency signal $f_o$;
a voltage controlled oscillator having a frequency control input connected to the transconductance amplifier output, and a pair of outputs, the outputs being the initial frequency $f_o$, and its complement $\overline{f_o}$, respectively, the output pair being fed back to input of the second charge pump, the divisor d being equal to 2, thereby making the frequency dividers fixed frequency divide by two circuits,
wherein the capacitively coupled transconductance amplifier output has an output current of $$I_z = g_m \left( \frac{I_2 T_0}{2C_3} - \frac{I_1 T_{ref}}{2C_1} \right),$$

such that $I_z$ charges or discharges a fifth capacitor $C_5$ to adjust its voltage to the proper value, the controlled oscillator output having a frequency of $$\frac{I_2 C_1}{I_1 C_3} \times f_{ref},$$

wherein $g_m$ is a transconductance value of the transconductance amplifier, and the fifth capacitor $C_5$ has a capacitive value of the capacitively coupled transconductance amplifier output.

2. The frequency synthesizer according to claim 1, wherein the charge pumps charge the capacitors for a complete half-cycle of the input signal.

3. The frequency synthesizer circuit according to claim 1, wherein the voltages $V_x$ and $V_y$ are proportional to the periods of the frequency signals $f_{ref}$ and the $f_o$, respectively.

4. The frequency synthesizer circuit according to claim 1, wherein the output frequency $f_o$ can be adjusted precisely via capacitive ratios $C_1$ and $C_3$ to have fractional and integer multiple of the reference frequency $f_{ref}$.

5. The frequency synthesizer according to claim 1, wherein circuitry of the frequency synthesizer is integrated in CMOS technology, thereby featuring low voltage supply and power consumption.

\* \* \* \* \*